US009437496B1

(12) United States Patent  
Chudzik et al.

(10) Patent No.: US 9,437,496 B1  
(45) Date of Patent: Sep. 6, 2016

(54) MERGED SOURCE DRAIN EPITAXY (71) Applicant: GLOBALFOUNDRIES INC., Grand Cayman (KY)

(72) Inventors: Michael P. Chudzik, Sunnyvale, CA (US); Brian J. Greene, Fishkill, NY (US); Edward P. Maciejewski, Wappingers Falls, NY (US); Kevin McStay, Hopewell Junction, NY (US); Shreesh Narasimha, Beacon, NY (US); Chengwen Pei, Danbury, CT (US); Werner A. Rausch, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/727,219

(22) Filed: Jun. 1, 2015

(51) Int. Cl.  
*H01L 29/10* (2006.01)  
*H01L 21/8234* (2006.01)  
*H01L 27/088* (2006.01)  
*H01L 21/02* (2006.01)

(52) U.S. Cl.  
CPC . *H01L 21/823425* (2013.01); *H01L 21/02667* (2013.01); *H01L 27/0886* (2013.01)

(58) Field of Classification Search  
CPC .............. H01L 21/82345; H01L 21/02667; H01L 27/0886; H01L 29/66795; H01L 27/0924  
See application file for complete search history.

(56) References Cited

U.S. PATENT DOCUMENTS

| | | | |
|---|---|---|---|
| 6,888,181 B1 | 5/2005 | Liao et al. | |
| 7,029,995 B2 | 4/2006 | Todd et al. | |
| 8,062,963 B1* | 11/2011 | van Dal | H01L 21/02381 |
| | | | 257/E21.103 |
| 8,119,484 B2 | 2/2012 | Forbes | |
| 8,278,179 B2 | 10/2012 | Lin et al. | |
| 8,362,574 B2 | 1/2013 | Kawasaki et al. | |
| 8,685,825 B2 | 4/2014 | Tang et al. | |
| 8,735,984 B2 | 5/2014 | Yin et al. | |
| 8,759,184 B2* | 6/2014 | Ho | H01L 29/66795 |
| | | | 257/288 |
| 2007/0231985 A1 | 10/2007 | Forbes | |
| 2008/0265321 A1 | 10/2008 | Yu et al. | |
| 2010/0065917 A1 | 3/2010 | Ohta et al. | |
| 2011/0223736 A1 | 9/2011 | Lin et al. | |
| 2012/0018730 A1* | 1/2012 | Kanakasabapathy | H01L 29/66795 |
| | | | 257/66 |
| 2012/0256238 A1* | 10/2012 | Ning | H01L 21/84 |
| | | | 257/280 |

(Continued)

OTHER PUBLICATIONS

"A Method for Obtaining a FinFET Device with AmorphousSilicon based Fin Merge" Disclosed Anonymously IP.com No. 000223298 IP.com Electronic Publication: Nov. 15, 2012.

(Continued)

*Primary Examiner* — Yosef Gebreyesus  
(74) *Attorney, Agent, or Firm* — Yuanmin Cai; Andrew M. Calderon; Roberts Mlotkowski Safran Cole & Calderson, P.C.

(57) ABSTRACT

A semiconductor device such as a FinFET includes a plurality of fins formed upon a substrate and a gate covering a portion of the fins. Diamond-shaped volumes are formed on the sidewalls of the fins by epitaxial growth which may be limited to avoid merging of the volumes or where the epitaxy volumes have merged. Because of the difficulties in managing merging of the diamond-shaped volumes, a controlled merger of the diamond-shaped volumes includes depositing an amorphous semiconductor material upon the diamond-shaped volumes and a crystallization process to crystallize the deposited semiconductor material on the diamond-shaped volumes to fabricate controllable and uniformly merged source drain.

20 Claims, 6 Drawing Sheets

(56) References Cited

U.S. PATENT DOCUMENTS

| | | |
|---|---|---|
| 2013/0175638 A1 | 7/2013 | Ho et al. |
| 2013/0334615 A1 | 12/2013 | Ho et al. |
| 2014/0027863 A1 | 1/2014 | Adam et al. |
| 2014/0120678 A1* | 5/2014 | Shinriki ............ H01L 29/66795 438/283 |
| 2014/0167163 A1 | 6/2014 | Cheng et al. |
| 2014/0239414 A1 | 8/2014 | Ho et al. |
| 2014/0339640 A1 | 11/2014 | Basker et al. |
| 2015/0041911 A1* | 2/2015 | Chan ............... H01L 21/823814 257/369 |

OTHER PUBLICATIONS

"Novel Finfet fin merge process wiht non-selective CVDdeposition technique" Disclosed Anonymously IP.com No. 000235795 IP.com Electronic Publication: Mar. 25, 2014.

* cited by examiner

MERGED SOURCE DRAIN EPITAXY

FIELD

Embodiments of invention generally relate to semiconductor devices and semiconductor device fabrication methods. More particularly, embodiments relate to semiconductor structures (e.g. FinFET structures, etc.) including merged source drain epitaxy.

BACKGROUND

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. At least the bottom portions of the fins of bulk FinFETs should be doped to avoid source-to-drain leakage below the gate. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

Doped semiconductor material such as silicon or silicon germanium (SiGe) may be provided by selective epitaxial growth on the sidewalls of the fin structure(s) during fabrication of FinFETs. Such growth results in faceted structures that, in some cases, merge into a continuous volume. The faceted epitaxy grown from the fins increases the volumes of the source/drain regions. Such epitaxial growth proceeds from the fins to self-limited, diamond-shaped volumes Problems associated with such structures include managing the merging of neighboring epitaxy. For example, in some locations neighboring epitaxy grown from respective fins may merge. In other locations, neighboring epitaxy grown from respective fins may not merge. Those area with epitaxy merging first creates faster growth facet over other area. This uniformity of growth may cause defects and affect device function. The epitaxial growth of ideally shaped volumes depends on various factors, including fin height, fin shape, fin spacing (pitch), fin erosion, box gauging, and fin cleaning.

SUMMARY

In a first embodiment of the present invention, a semiconductor device fabrication process includes forming a first fin and a second fin upon a semiconductor substrate, forming a first diamond shaped volume surrounding the first fin and a second diamond shaped volume surrounding the second fin by growing epitaxy material from sidewalls of the first fin and from sidewalls of the second fin, respectively, merging the first diamond shaped volume and the second diamond shaped volume by depositing an amorphous semiconductor material upon the first diamond shaped volume and the second diamond shaped volume, and crystallizing the amorphous semiconductor material deposited on the first diamond shaped volume and the second diamond shaped volume.

In another embodiment of the present invention, a semiconductor device fabrication process includes forming a first fin and a second fin upon a semiconductor substrate, forming a first partial diamond shaped volume surrounding the first fin and a second partial diamond shaped volume surrounding the second fin by growing epitaxy material from sidewalls of the first fin and from sidewalls of the second fin, respectively, merging the first partial diamond shaped volume and the second partial diamond shaped volume by depositing an amorphous semiconductor material upon the first partial diamond shaped volume and the second partial diamond shaped volume, and crystallizing the amorphous semiconductor material on the first partial diamond shaped volume and the second partial diamond shaped volume.

In yet another embodiment of the preset invention, a semiconductor device includes a semiconductor substrate, a first fin and a second fin upon the semiconductor substrate, a gate structure upon the first fin, the second fin, and semiconductor substrate, a first diamond shaped volume surrounding the first fin and a second diamond shaped volume surrounding the second fin, and crystallized semiconductor material upon the first diamond shaped volume and upon the second diamond shaped volume.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3A depicts an isometric view, FIG. 3B depicts a cross section view.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

FinFET structures are characterized by fins formed on semiconductor substrates. Such substrates include bulk silicon substrates (fin on bulk) and SOI substrates (fin on SOI) as discussed above. Fins can further be formed on oxide over bulk silicon substrates such as bulk silicon wafers (fin on oxide over bulk). The FIGs. illustrate exemplary steps that may be performed sequentially in fabricating a FinFET structure, it being appreciated that additional steps may be necessary depending on the desired features of the FinFET structure. Fabrication may commence with a partially completed structure, in which case one or more of the steps described below could be omitted.

Referring now to the figures, exemplary process steps of forming a structure 10 in accordance with embodiments of the present invention are shown, and will now be described in greater detail below. It should be noted that some of the figures depict a cross section view of structure 10. Furthermore, it should be noted that while this description may refer to some components of the structure 10 in the singular tense, more than one component may be depicted throughout the figures and like components are labeled with like numerals. The specific number of components depicted in the figures and the cross section orientation was chosen for illustrative purposes only.

Figure 1:
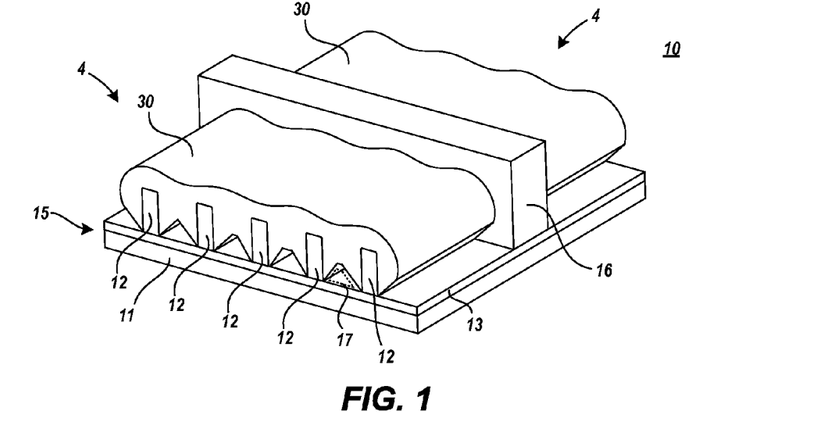
FIG. 1 depicts an isometric view of a semiconductor structure at an intermediate stage of semiconductor device fabrication, in accordance with various embodiments of the present invention.

FIG. 1 depicts an isometric view of exemplary semiconductor structure 10 at an intermediate stage of semiconductor device fabrication. Structure 10 may be a FinFET device including a plurality of fins 12 formed upon a substrate 15 (e.g., in a wafer, etc.) and a gate 16 covering a portion of the fins 12. The substrate may include a base substrate 11 and a buried insulator layer 13. The portion of the fins 12 covered by the gate 16 may serve as a channel region of the FinFET device. Portions of the fins 12 that extend out from under the gate 16 may serve as source and drain regions 4 of the FinFET device.

Diamond-shaped volumes are formed on the sidewalls of the fins 12 by epitaxial growth, thereby enlarging the source/drain regions 4. Growth may be limited to avoid merging of the volumes. However, various embodiments of the present invention may be utilized in instances where the epitaxy volumes have merged. The epitaxy growth of the diamond-shaped volumes form unfilled regions 17 near the base of the fin 12.

Because of the difficulties in managing merging of diamond-shaped volumes, embodiments of the present invention include a controlled merger of the diamond-shaped volumes. A controlled merge fabrication process includes depositing an amorphous semiconductor material upon the diamond-shaped volumes and a crystallization process to crystallize the deposited amorphous semiconductor material. The crystallized diamond-shaped volumes and semiconductor material form merged source drain merged crystalline material 30.

Figure 2A:
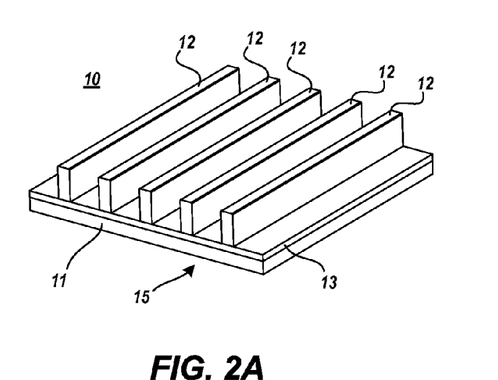
FIG. 2A depicts an isometric view and FIG. 2B depicts a cross section view of a semiconductor structure at an intermediate stage of semiconductor device fabrication, in accordance with various embodiments of the present invention.
Figure 2B:
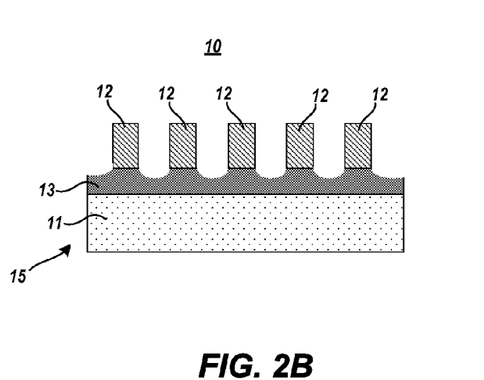

FIG. 2A depicts an isometric view and FIG. 2B depicts a cross section view of a semiconductor structure at an intermediate stage of semiconductor device fabrication, in accordance with various embodiments of the present invention. At the present stage of fabrication, fins 12 are formed upon substrate 15.

An exemplary structure 10 includes fins 12 formed from a SOI layer (not shown) as is known in the art upon a substrate 15. The fin 12 heights are commensurate with the thickness of the SOI layer from which they are formed. Fin 12 heights may be 50 nanometers or less in one or more exemplary embodiments discussed herein. Fin 12 widths may be 20 nanometers or less in one or more of the exemplary embodiments. The base portions of the fins 12 adjoin an insulating layer 13 such as a buried oxide (BOX) layer, for example silicon dioxide. The base semiconductor layer 11 may comprise silicon. The SOI layer from which the fins 12 are formed and the bottom semiconductor layer 11 are not necessarily comprised of the same materials. While the fins 12 are shown as having vertical side walls and horizontal top surfaces in the schematic illustrations, it will be appreciated that fins 12 in FinFET devices may have somewhat different configurations such as triangular configurations wherein the fin 12 bases are wider than the tops of the fins 12. For example, tapered fins 12 formed on bulk silicon substrates (not shown) facilitate filling the cavities between fins with oxide materials (not shown) without forming voids. The structure 10 may accordingly include fins 12 having sides that are not completely vertical.

Fin heights, widths and spacing are further chosen in accordance with manufacturer preferences. Fin heights in some embodiments range between 10-50 nm. Fin 12 heights are preferably equal. The substrate 15 in an exemplary embodiment is a (100) substrate oriented such that the side walls of the crystalline silicon fins 12 are (110) surfaces. As discussed above, the side walls of the fins 12 may not be exactly vertical. Surfaces described as (110) surfaces herein are at least close to being (110) surfaces but may or may not be exactly (110) surfaces.

Substrate 15 may be a layered substrate such as Si/SiGe, a silicon-on-insulator (SOI), or a SiGe-on-insulator (SGOI). Substrate 15 may alternatively be a bulk semiconductor substrate which comprises undoped Si, n-doped Si, p-doped Si, single crystal Si, polycrystalline Si, amorphous Si, Ge, SiGe, SiC, SiGeC, GaAs, InAs, InP, etc. When substrate 15 is a bulk substrate, one or more fins 12 may be etched from the substrate 15.

When substrate 15 is a layered substrate, it may include a base substrate 11, a buried dielectric layer 13 formed on top of the base substrate, and a SOI layer (not shown) formed on top of the buried dielectric layer. The buried dielectric layer 13 may isolate the SOI layer from the base substrate 11. The plurality of fins 12 may be etched from the SOI layer. The base substrate 11 may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate 11 may be about, but is not limited to, several hundred microns thick. For example, the base substrate may have a thickness ranging from 0.5 mm to about 1.5 mm.

The buried dielectric layer 13 may include any of several dielectric materials, for example, oxides, nitrides and oxynitrides of silicon. The buried dielectric layer 13 may also include oxides, nitrides and oxynitrides of elements other than silicon. In addition, the buried dielectric layer 13 may include crystalline or non-crystalline dielectric material. Moreover, the buried dielectric layer 13 may be formed using any of several known methods, for example, thermal or plasma oxidation or nitridation methods, chemical vapor deposition methods, and physical vapor deposition methods. The buried dielectric layer 13 may have a thickness ranging from about 5 nm to about 200 nm. In one embodiment, the buried dielectric layer 13 may have a thickness ranging from about 150 nm to about 180 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate 11 and the SOI layer include semiconducting materials that include at least different crystallographic orientations. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 12 may be etched from the SOI layer. Because the plurality of fins 12 may be etched from the SOI layer, they too may include any of the characteristics listed above for the SOI layer.

When substrate 15 is a bulk substrate, the bulk substrate may be etched to form fins 12. Dielectric portions may then be formed between fins 12 and may include any of several dielectric materials, for example, oxides, nitrides and oxynitrides of silicon. The dielectric portions may also include oxides, nitrides and oxynitrides of elements other than silicon. In addition, the dielectric portions may include crystalline or non-crystalline dielectric material. Moreover, the dielectric portions may be formed using any of several known methods, for example, chemical vapor deposition methods, and physical vapor deposition methods. The dielectric portions may have a thickness ranging from about 5 nm to about 200 nm. In one embodiment, the dielectric portions may have a thickness ranging from about 5 nm to about 50 nm, with 10 nm to 25 nm preferred. In certain embodiments, dielectric portions may be etched or recessed following their formation.

Figure 3A:
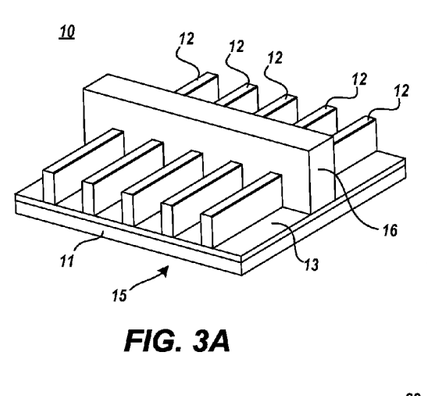
Figure 3B:
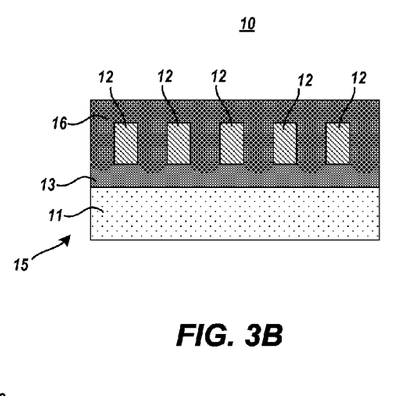
Figure 3C:
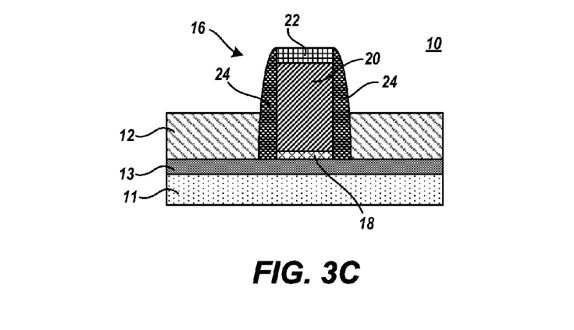
FIG. 3C depicts an orthogonal cross section view of a semiconductor structure at an intermediate stage of semiconductor device fabrication, in accordance with various embodiments of the present invention.

FIG. 3A depicts an isometric view, FIG. 3B depicts a cross section view, and FIG. 3C depicts an orthogonal cross section view of semiconductor structure 10 at an intermediate stage of semiconductor device fabrication, in accordance with various embodiments of the present invention. At the present stage of fabrication one or more gate structures 16 are formed.

If a gate-first process is employed, such as gate structure 16 shown in FIG. 3C, the gate structure 16 may comprise a gate dielectric 18 (e.g., high-k such as hafnium oxide, etc.), a gate conductor 20 (e.g., metal gate, etc.), and/or a gate cap 22 (e.g., a nitride, etc.). Any suitable deposition technique can be used to deposit the dielectric 18, conductor 20, and/or cap 22, including but not limited to atomic layer deposition, chemical vapor deposition, physical vapor deposition, sputtering, plating, etc. While gate material is shown both above and between the fins 12 in the illustrated structure 10, it will be appreciated that it may alternatively be formed only between the fins. Dielectric spacers 24 may be formed around the gate structure as shown schematically in FIG. 3C.

If a gate-last process is employed, such as gate structure 16 shown in FIG. 3A, a dummy gate is formed wherein the dummy gate may comprise a dummy gate dielectric (e.g., oxide) covering fins and a dummy gate material (e.g., polysilicon) on top of the dummy gate dielectric. This dummy gate is removed in a later process familiar to those of skill in the art and a replacement gate structure 16 is patterned at an appropriate stage of the transistor fabrication process. The structure shown in FIG. 3A-FIG. 3C may include further elements such as dielectric fin caps and/or other elements depending upon the fabrication method employed to produce a desired FinFET structure 10.

The gate structure 16 may be formed, for example, by first providing a gate dielectric 18 layer atop structure 10 (i.e. upon substrate 15 and fins 12) utilizing a conventional deposition process including, for example, chemical vapor deposition, plasma enhanced chemical vapor deposition or chemical solution deposition. A conductive material 20 may be formed upon gate dielectric 18, and a gate cap 22 formed upon gate 20. The stack may then patterned by lithography and etched to form a gate stack. In certain embodiments, spacers 24 may be formed on the sides of gate stack. The gate cap 22 may be associated with a masking layer utilized in the lithography and etching processes to form the gate stack. Generally, gate structure may be formed by other known processes without deviating from the spirit of those embodiments herein claimed.

Figure 4A:
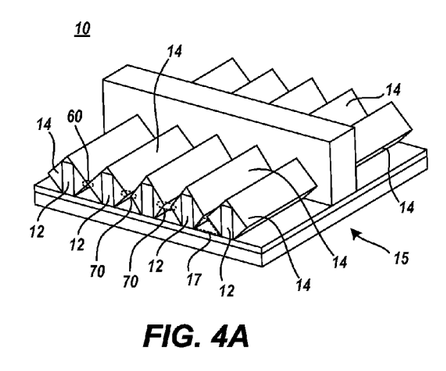
FIG. 4A depicts an isometric view and FIG. 4B depicts a cross section view of a semiconductor structure at an intermediate stage of semiconductor device fabrication, in accordance with various embodiments of the present invention.
Figure 4B:
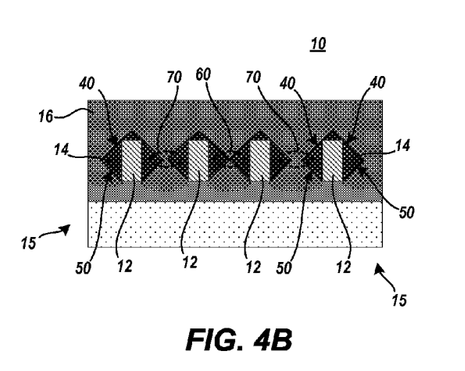

FIG. 4A depicts an isometric view and FIG. 4B depicts a cross section view of semiconductor structure 10 at an intermediate stage of semiconductor device fabrication, in accordance with various embodiments of the present invention. At the present stage of fabrication, diamond-shaped volume 14 is epitaxially grown around fin 12.

Generally, expitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal planar boundary will take on a <100> orientation.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

Diamond-shaped volumes 14 are formed on the fins 12, thereby enlarging the source/drain regions 4 of the structure 10. Fin 12 sidewall surfaces are <110> surfaces ad epitaxial growth thereon forms diamond-shaped volumes 14 due to the fact that the growth rate on <111> planes is considerably less than on <110> planes. As such, self-limiting <111> bound diamond-shaped volumes 14 are formed. The upper boundary of the self-limited <111> bound diamond-shaped volumes 14 is further referred to as boundary 40. The lower boundary of the self-limited <111> bound diamond-shaped volumes 14 is further referred to as boundary 50. Boundary 40 generally includes surfaces facing upwards and boundary 50 generally includes surfaces facing downwards.

A non limiting list of exemplary expitaxial materials are: silicon germanium alloy (SiGe), Silicon (Si), in-situ boron doped SiGe or Si, in situ phosphorus or arsenic doped Si or SiGe, with doping levels ranging from, e.g., 1e19 to 5e21. etc. To employ the process described above in the fabrication of a pFET structure, boron-doped SiGe may be employed in one or more embodiments for growth of the diamond-shaped volumes 14 on the sidewalls of the crystalline silicon fins 12. To fabricate nFET structures, phosphorus-doped SiGe may be employed in one or more embodiments for growth of the diamond-shaped volumes 14. The doping can be chosen as desired for particular transistor applications as the fins 12 may have been subsequently doped.

In various embodiments, neighboring diamond-shaped volumes 14 may meet or merge as depicted in region 60. In addition, or alternatively, neighboring diamond-shaped volumes 14 need not meet or merge as is depicted in region 70.

The growth of diamond-shaped epitaxy material is grown from the sidewalls of fins 12 and may result in unfilled region 17 being formed between neighboring fins 12 near the base of the respective fins 12. Generally, unfilled region 17 is the absence of epitaxial material grown from fins 12 seed surfaces.

Figure 5A:
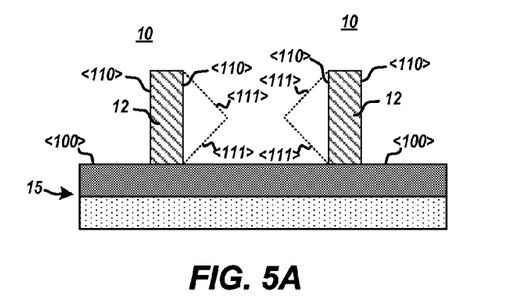
FIG. 5A and FIG. 5B depicts cross section views of the intermediate stage of semiconductor device fabrication as depicted in FIG. 4A and in FIG. 4B, in accordance with various embodiments of the present invention.
Figure 5B:
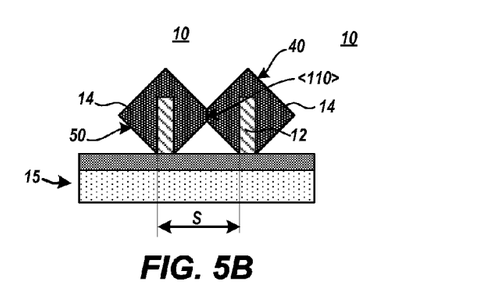

Referring to FIG. 5A, epitaxy growth is quickest from <100> planes and is slowest from <111> planes. When epitaxy growth from fin 12 sidewalls is complete, a self-limited <111> boundary forms and further epitaxial growth from the <111> plane slows. During epitaxial grown neighboring diamond-shaped volumes may merge. For example, as shown in FIG. 5B, tips of neighboring diamond-shaped volumes 14 may meet to form a <110> there between. Further, the upper surface of the merged diamond-shaped volumes 14 form a <100> plane and epitaxy grows relatively quickly therefrom in a generally vertical direction.

There are many variables that affect whether particular diamond-shaped volumes 14 merge, while other diamond-shaped volumes 14 upon structure 10 do not. One of these variables are fin 12 geometry. If the geometry of fins 12 within a neighboring fin 12 pair differ, it is difficult to control diamond shaped epitaxy merging. Thus, merging of diamond-shaped volumes 14 is highly dependent upon the fin 12 geometry. For example, fin height similarity, fin width similarity, fin shape, etc. of neighboring fins 12 will affect whether particular neighboring diamond-shaped volumes 14 merge. Further, fin 12 pair pitch or spacing (e.g. S, etc.) will affect merging. Even further, fin 12 erosion and affects from fin 12 clean processing will also affect merging. Therefore, it is desired to form controlled merging source drain regions 4 independent of neighboring fin geometry deficiencies.

Figure 6A:
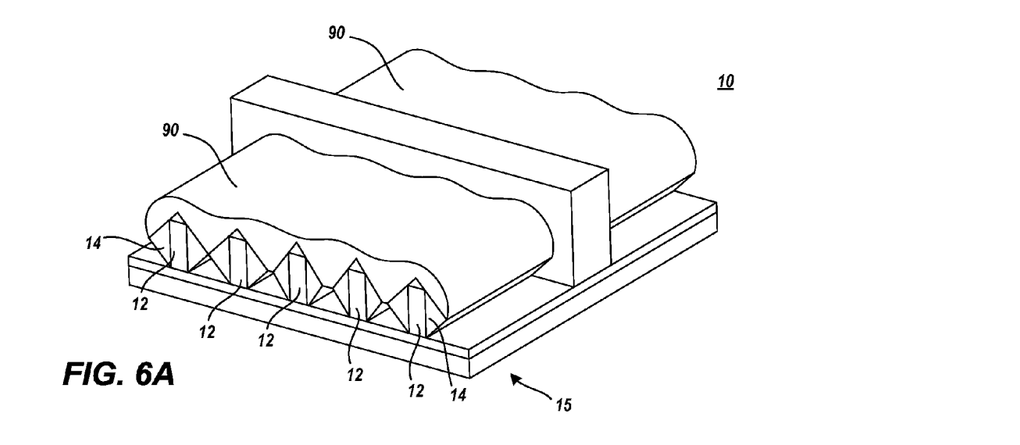
FIG. 6A depicts an isometric view and FIG. 6B depicts a cross section view of a semiconductor structure at an intermediate stage of semiconductor device fabrication, in accordance with various embodiments of the present invention.
Figure 6B:
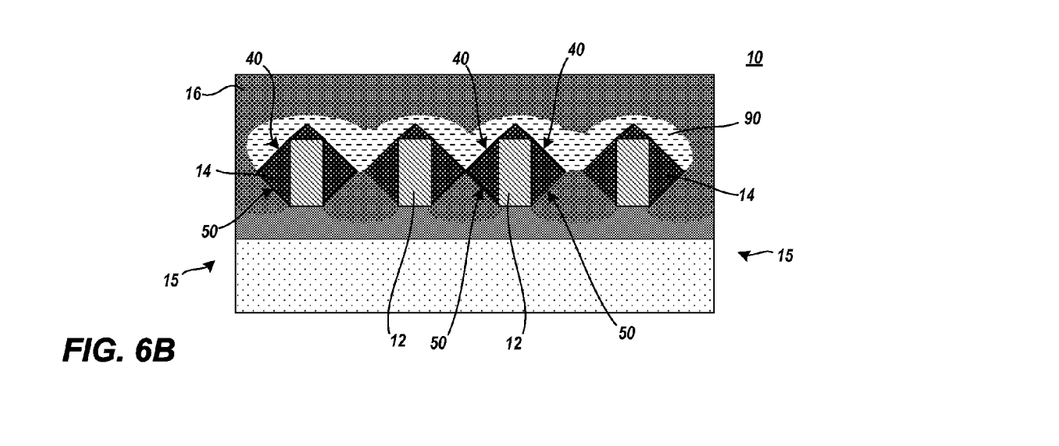

FIG. 6A depicts an isometric view and FIG. 6B depicts a cross section view of semiconductor structure 10 at an intermediate stage of semiconductor device fabrication, in accordance with various embodiments of the present invention. At the present stage of fabrication, semiconductor material 90 is deposited upon the diamond-shaped volumes 14.

Semiconductor material 90 may be any suitable non-crystallized or single crystal semiconductor material that may be conformally deposited utilizing thin-film deposition methods, such as plating, CVD, ALD, etc. For example, material 90 may be amorphous Si, poly Si, amorphous SiGe, poly SiGe, etc. In regions 70 where neighboring diamond-shaped volumes 14 do not merge, semiconductor material 90 pinches off at the upper boundary 40 lower boundary 50 interface (i.e., at the points or vertices of the diamond-shaped volumes 14). Pinch off generally means the deposited material 90 physically bridges adjacent diamond shaped volumes 14. That is, material 90 does not extend into unfilled region 17. Alternatively, the material 90 pinches off at the upper boundary 40. In regions 60 where neighboring diamond-shaped volumes 14 do merge, semiconductor material 90 is formed upon the upper boundary 40. Generally, material 90 may be conformally deposited upon diamond-shaped volumes 14 adjacent to gate structure 16 within source and drain regions 4 thereby merging respective diamond-shaped volumes 14. Material 90 may be deposited to a thickness of around 10 to 50 nm, and to a thickness more typically between 20 to 30 nm.

Figure 7A:
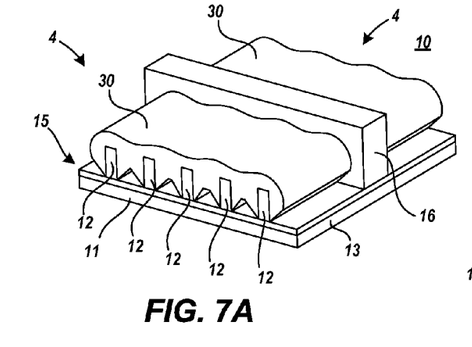
FIG. 7A depicts an isometric view and FIG. 7B depicts a cross section view of a semiconductor structure at an intermediate stage of semiconductor device fabrication, in accordance with various embodiments of the present invention.
Figure 7B:
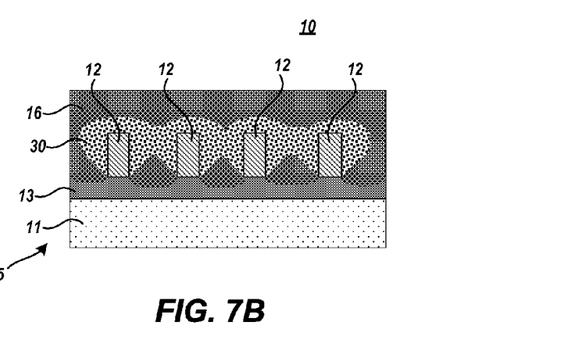

FIG. 7A depicts an isometric view and FIG. 7B depicts a cross section view of semiconductor structure 10 at an intermediate stage of semiconductor device fabrication, in accordance with various embodiments of the present invention. At the present stage of fabrication, material 90 and diamond-shaped volumes 14 are crystallized/re-crystallized forming source drain merged crystalline material 30.

A crystallization process may be utilized to crystallize material 90 and diamond-shaped volumes 14 to form source drain merged crystalline material 30. When material 90 is an amorphous, for example, Solid Phase Epitaxy (SPE) may be utilized to crystallize material 90 and diamond-shaped volumes 14. Generally, SPE is a transition between the amorphous and crystalline phases of a material. SPE processes typically include depositing an amorphous material upon a crystalline material. The combination is heated (500° C.-600° C.) to crystallize the amorphous material. The crystalline material serves as a template for crystal growth to form source drain merged crystalline material 30. When material 90 is a polycrystalline material, for example, an annealing process may be utilized to re-crystallize material 90 and diamond shaped volumes 14. For example, the polycrystalline material 90 and volumes 14 may be annealed at a temperature between 500° C.-650° C. for a period between 30-90 minutes to re-crystallize the materials to form source drain merged crystalline material 30. In some embodiments, when material 90 is amorphous, following the crystallization/re-crystallization of material 90 and diamond-shaped volumes 14, the amorphous material 90 may be removed from undesired locations such as on gates of transistors and boundary area of different devices. For example, a gas phase hydrochloric acid etchant may be utilized to selectively remove amorphous silicon from poly.

Figure 8:
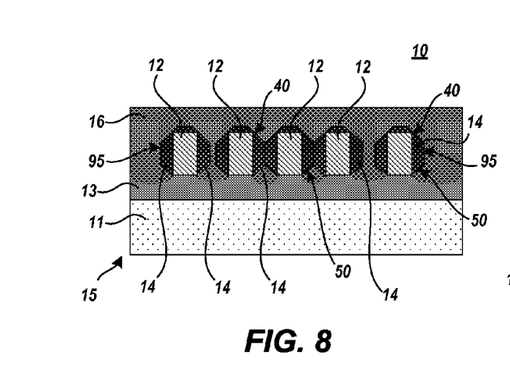
FIG. 8-FIG. 10 depict cross section views of a semiconductor structure at an intermediate stages of semiconductor device fabrication, in accordance with various embodiments of the present invention.
Figure 9:
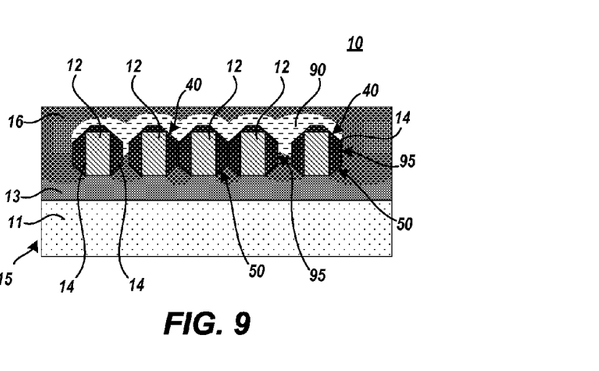
Figure 10:
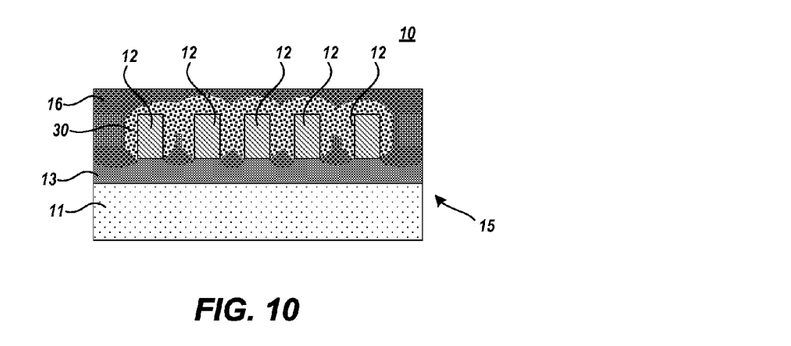

FIG. 8-FIG. 10 depict cross section views of semiconductor structure at an intermediate stages of semiconductor device 10 fabrication, in accordance with various embodiments of the present invention. In an alternative embodiment, as shown in FIG. 8-FIG. 10, fins 12 pitch may be reduced relative to the pitch of fins 12 utilized to form full diamond-shaped volumes 14, as previously described. When the fin 12 pitch is reduced, the diamond-shaped volume epitaxial growth may be partial. In other words, neighboring diamond-shaped volumes 14 may merge prior to forming a fully formed self-limited <111> boundary. As such, diamond-shaped volumes 14 partially form and include a side <110> boundary. The side <110> boundary bound diamond-shaped volumes 14 is further referred to as side boundary 95. Boundary 95 generally includes side facing surfaces. In sum, in embodiments with reduced fin 12 pitch, partially formed diamond-shaped volumes 14 may include upper boundary 40, side boundary 95, and lower boundary 50.

Semiconductor material 90 is subsequently deposited upon the partial diamond-shaped volumes 14. The material 90 may pinch off at the interface of the side boundary 95—lower boundary 50, upon the side boundary 95, at the interface of the side boundary 95—upper boundary 40, and/or upon the upper boundary 40. The semiconductor material 90 and partial diamond-shaped volumes 14 are subsequently crystallized/re-crystallized forming source drain merged crystalline material 30.

Figure 11:
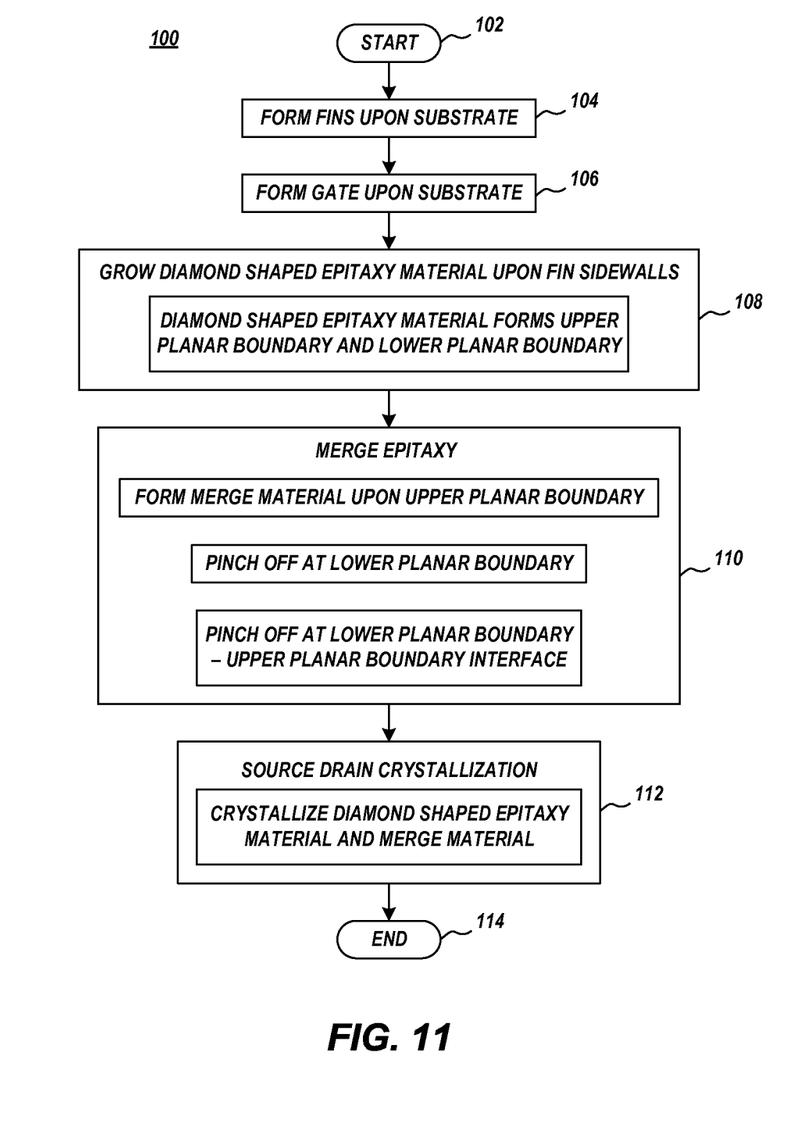
FIG. 11 and FIG. 12 depict exemplary semiconductor device fabrication methods, in accordance with various embodiments of the present invention.

FIG. 11 depicts an exemplary semiconductor device fabrication method 100, in accordance with various embodiments of the present invention. Method 100 may be utilized to form an e.g., a FinFET device that includes a plurality of fins 12 formed upon a substrate 15, a gate 16, and source drain merged crystalline material 30 that merges the fins 12 in the source drain regions of the device. The merged crystalline material 30 is crystallized or re-crystallized combination of epitaxially grown diamond-shaped volumes 14 and semiconductor material 90 formed upon the diamond-shaped volumes 14. The merged crystalline material 30 formation process provides for the controlled merging of source drain regions of the FinFET device.

Method 100 beings at block 102 and continues with forming fins 12 upon a substrate 15 (block 104). For example, fins 12 may be etched from an SOI layer when substrate 15 is a multilayered substrate or fins 12 may be etched from a bulk substrate when substrate 15 is the bulk substrate. Method 100 may continue with forming a gate structure 16 upon the substrate (block 106). The gate 16 may be a dummy gate structure, a replacement gate structure, a final gate structure, etc. and may be formed upon the substrate 15 and upon the fins 12 orthogonal to the fins 12. Generally, the fin 12 material below the gate structure 16 may be the channel region of the FinFET device and the fin 12 material extending outwardly from the gate structure 16 may be the source and drain regions 4 of the finFET device.

Method 100 may continue by growing diamond-shaped volumes 14 from the fin 12 sidewalls, respectively (block 108). The epitaxial growth forms fully formed diamond-shaped volumes 14 surrounding fins 12, respectively. The diamond-shaped volumes 14 include a self-limiting <111> bound plane which further includes an upper boundary 40 and a lower boundary 50. The upper boundary 40 is generally the upper portion of the self-limited <111> bound plane and the lower boundary 50 is generally the lower portion of the self-limited <111> bound plane. An unfilled region 17 exists between respective boundaries 50 of neighboring volumes 14 near the base and substrate 15 of associated fins 12. Neighboring diamond-shaped volumes 14 may or may not merge by meeting.

Method 100 may continue by merging the epitaxial diamond-shaped volumes 14 (block 110). Semiconductor material 90 is formed upon the diamond-shaped volumes 14 by conformal deposition. For example, material 90 is formed upon the upper boundary 40 of diamond-shaped volumes 14. The material 90 may pinch off at the lower boundary 50 surfaces of neighboring volumes 14, the material 90 may pinch off at the lower boundary 50 upper boundary 40 interface (e.g., material 90 pinches off at the points of neighboring volumes 90, etc.), the material 90 may pinch off at the upper boundary 40 surfaces of neighboring volumes 14, or any combination. For example, the material 90 may pinch off upon the upper boundary 40 of a first diamond-shaped volume 14 and may pinch off upon the lower boundary 50 of a second neighboring diamond-shaped volume 14.

Method 100 may continue with crystallizing or re-crystallizing the source drain regions (block 112). For example, the semiconductor material 90 and the epitaxially grown diamond-shaped volumes 14 may be crystallized or re-crystallized and may form source drain merged crystalline material 30 that generally merges diamond-shaped volumes 14, source drain regions 4, etc. Method 100 may end at block 114.

Figure 12:
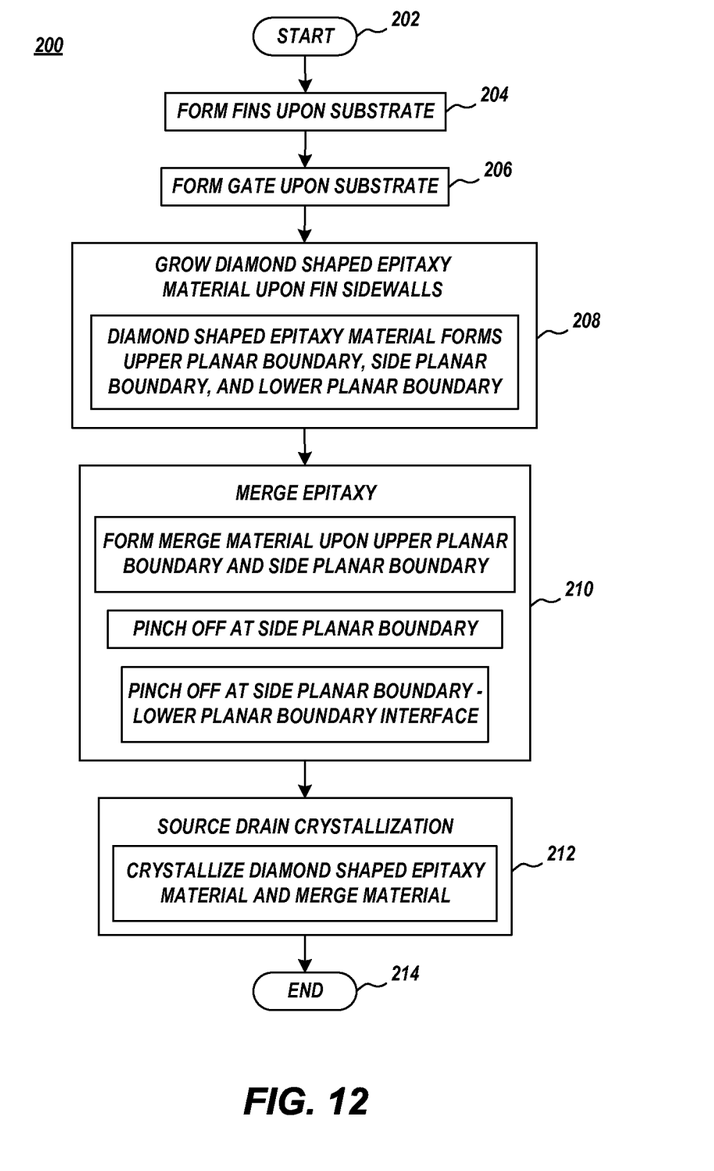

FIG. 12 depicts an exemplary semiconductor device fabrication method 200, in accordance with various embodiments of the present invention. Method 200 may be utilized to form an e.g., a FinFET device that includes a plurality of fins 12 having a reduced pitch formed upon a substrate 15, a gate 16, and source drain merged crystalline material 30 that merges the fins 12 in the source drain regions 4 of the device. The merged crystalline material 30 is crystallized or re-crystallized combination of epitaxially grown diamond-shaped volumes 14 and semiconductor material 90 formed upon the diamond-shaped volumes 14. The merged crystalline material 30 formation process provides for the controlled merging of source drain regions of the FinFET device.

Method 200 beings at block 102 and continues with forming fins 12 upon a substrate 15 (block 204). For example, fins 12 may be etched from an SOI layer when substrate 15 is a multilayered substrate or fins 12 may be etched from a bulk substrate when substrate 15 is the bulk substrate. Method 200 may continue with forming a gate structure 16 upon the substrate (block 206). The gate 16 may be a dummy gate structure, a replacement gate structure, a final gate structure, etc. and may be formed upon the substrate 15 and upon the fins 12 orthogonal to the fins 12. Generally, the fin 12 material below the gate structure 16 may be the channel region of the FinFET device and the fin 12 material extending outwardly from the gate structure 16 may be the source and drain regions 4 of the FinFET device.

Method 200 may continue by growing diamond-shaped volumes 14 from the fin 12 sidewalls, respectively (block 208). The epitaxial growth forms partial diamond-shaped volumes 14 surrounding fins 12, respectively. The partial diamond-shaped volumes 14 include a self-limiting <110> and <111> bound plane and further includes an upper boundary 40, a lower boundary 50, and a side boundary 90. The upper boundary 40 is generally the upper portion of the self-limited <111> bound plane, the lower boundary 50 is generally the lower portion of the self-limited <111> bound plane, and the side boundary 90 is generally the <110> bound plane. An unfilled region 17 exists between respective boundaries 50 of neighboring volumes 14 near the base and substrate 15 of associated fins 12. Neighboring partial diamond-shaped volumes 14 may or may not merge by meeting.

Method 200 may continue by merging the epitaxial diamond-shaped volumes 14 (block 210). Semiconductor material 90 is formed upon the diamond-shaped volumes 14 by conformal deposition. For example, material 90 is formed upon the upper boundary 40 of diamond-shaped volumes 14. The material 90 may pinch off at the lower boundary 50 surfaces of neighboring volumes 14, the material 90 may pinch off at the lower boundary 50 upper boundary 40 interface (e.g., material 90 pinches off at the points of neighboring volumes 90, etc.), the material 90 may pinch off at the upper boundary 40 surfaces of neighboring volumes 14, material 90 may pinch off at the side boundary 90 surfaces of neighboring volumes 14, or any combination. For example, the material 90 may pinch off upon the upper boundary 40 of a first diamond-shaped volume 14 and may pinch off upon the side boundary 90 of a second neighboring diamond-shaped volume 14.

Method 200 may continue with crystallizing or re-crystallizing the source drain regions (block 212). For example, the semiconductor material 90 and the epitaxially grown diamond-shaped volumes 14 may be crystallized or re-crystallized and may form source drain merged crystalline material 30 that generally merges diamond-shaped volumes 14, source drain regions 4, etc. Method 200 may end at block 214.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

Unless described otherwise, or in addition to that described herein, "forming," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to the applicable polycrystalline material.

References herein to terms such as "vertical", "horizontal", etc. are made by way of example, and not by way of limitation, to establish a frame of reference. The term "horizontal" as used herein is defined as a plane parallel to the conventional plane or surface of the substrate 15, regardless of the actual spatial orientation of the semiconductor substrate 15. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A semiconductor device fabrication process comprising:
    forming a first fin and a second fin upon a semiconductor substrate;
    forming a first diamond shaped volume surrounding the first fin and a second diamond shaped volume surrounding the second fin by growing epitaxy material from sidewalls of the first fin and from sidewalls of the second fin, respectively;
    merging the first diamond shaped volume and the second diamond shaped volume by depositing an amorphous semiconductor material upon the first diamond shaped volume and the second diamond shaped volume, and;
    crystallizing the amorphous semiconductor material deposited on the first diamond shaped volume and the second diamond shaped volume.

2. The process of claim 1, wherein forming the first diamond shaped volume surrounding the first fin and the second diamond shaped volume surrounding the second fin further comprises:
    forming a self-limited diamond shaped boundary comprising an upper portion including upward facing surfaces and a lower portion including downward facing surfaces.

3. The process of claim 1, wherein the first diamond shaped volume meets the second diamond shaped volume.

4. The process of claim 1, wherein forming the first diamond shaped volume surrounding the first fin and the second diamond shaped volume surrounding the second fin further results in an un-filled region between the first diamond shaped volume and the second diamond shaped volume adjacent to the first fin base, adjacent to the second fin base, and adjacent to the semiconductor substrate.

5. The process of claim 1, wherein crystallizing the amorphous semiconductor material on the first diamond shaped volume, and the second diamond shaped volume comprises:
    heating the amorphous semiconductor material deposited on the first diamond shaped volume and the second diamond shaped volume.

6. The process of claim 2, wherein the self-limited diamond shaped boundary is a <111> boundary.

7. The process of claim 1, wherein forming the first diamond shaped volume surrounding the first fin and the second diamond shaped volume surrounding the second fin comprises:
    forming the first diamond shaped from a <110> seed surface of the first fin, and;
    forming the second diamond shaped from a <110> seed surface of the second fin.

8. The process of claim 1, wherein the semiconductor substrate is a layered substrate.

9. The process of claim 1, wherein a gap exists between the first diamond shaped volume and the second diamond shaped volume.

10. A semiconductor device fabrication process comprising:
- forming a first fin and a second fin upon a semiconductor substrate;
- forming a first partial diamond shaped volume surrounding the first fin and a second partial diamond shaped volume surrounding the second fin by growing epitaxy material from sidewalls of the first fin and from sidewalls of the second fin, respectively;
- merging the first partial diamond shaped volume and the second partial diamond shaped volume by depositing an amorphous semiconductor material upon the first partial diamond shaped volume and the second partial diamond shaped volume, and;
- crystallizing the amorphous semiconductor material on the first partial diamond shaped volume and the second partial diamond shaped volume.

11. The process of claim 10, wherein forming the first partial diamond shaped volume surrounding the first fin and the second partial diamond shaped volume surrounding the second fin further comprises:
- forming a partial diamond shaped boundary comprising an upper portion, a side portion, and a lower portion.

12. The process of claim 10, wherein the first partial diamond shaped volume meets the second partial diamond shaped volume.

13. The process of claim 10, wherein forming the first partial diamond shaped volume surrounding the first fin and the second diamond shaped volume surrounding the second fin further comprises:
- forming an un-filled region between the first partial diamond shaped volume and the second partial diamond shaped volume adjacent to the first fin base, adjacent to the second fin fins, and adjacent to the semiconductor substrate.

14. The process of claim 10, wherein crystallizing the semiconductor material, the first partial diamond shaped volume, and the second partial diamond shaped volume further comprise:
- heating the amorphous semiconductor material deposited on the first partial diamond shaped volume and the second partial diamond shaped volume.

15. The process of claim 11, wherein the partial diamond shaped boundary comprises a <111> boundary and a <110> boundary.

16. The process of claim 10, wherein forming the first partial diamond shaped volume surrounding the first fin and the second partial diamond shaped volume surrounding the second fin further comprises:
- forming the first partial diamond shaped from a <110> seed surface of the first fin, and;
- forming the second partial diamond shaped from a <110> seed surface of the second fin.

17. The process of claim 10, wherein the semiconductor substrate is a layered substrate.

18. The process of claim 10, wherein a gap exists between the first diamond shaped volume and the second diamond shaped volume.

19. A semiconductor device comprising:
- a semiconductor substrate;
- a first fin and a second fin upon the semiconductor substrate;
- a gate structure upon the first fin, the second fin, and semiconductor substrate;
- a first diamond shaped volume surrounding the first fin and a second diamond shaped volume surrounding the second fin, and;
- crystallized semiconductor material upon the first diamond shaped volume and upon the second diamond shaped volume.

20. The semiconductor device of claim 19, wherein a gap exists between the first diamond shaped volume and the second diamond shaped volume and wherein the crystallized semiconductor material pinches off between the vertices within the gap between the first diamond shaped volume and the second diamond shaped volume.

* * * * *